(12) United States Patent
Cheng

(10) Patent No.: US 11,796,927 B2
(45) Date of Patent: Oct. 24, 2023

(54) METHOD AND DEVICE FOR ENHANCING ALIGNMENT PERFORMANCE OF LITHOGRAPHIC DEVICE

(71) Applicant: CHANGXIN MEMORY TECHNOLOGIES, INC., Hefei (CN)

(72) Inventor: Zhao Cheng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/647,840

(22) Filed: Jan. 12, 2022

(65) Prior Publication Data

US 2022/0308470 A1    Sep. 29, 2022

Related U.S. Application Data

(63) Continuation of application No. PCT/CN2021/114113, filed on Aug. 23, 2021.

(30) Foreign Application Priority Data

Mar. 24, 2021   (CN) .......................... 202110314210.8

(51) Int. Cl.
*G03F 9/00*   (2006.01)

(52) U.S. Cl.
CPC .......... *G03F 9/7092* (2013.01); *G03F 9/7046* (2013.01); *G03F 9/7065* (2013.01)

(58) Field of Classification Search
CPC ..... G03F 9/7046; G03F 9/7065; G03F 9/7092
See application file for complete search history.

(56) References Cited

U.S. PATENT DOCUMENTS

| | | | |
|---|---|---|---|
| 6,100,987 A * | 8/2000 | Kawakubo | G03F 9/7088 250/548 |
| 6,528,219 B1 | 3/2003 | Conrad | |
| 10,295,409 B2 | 5/2019 | Toshima et al. | |
| 10,466,601 B2 | 11/2019 | Polo et al. | |
| 2016/0048087 A1* | 2/2016 | Yang | G03F 9/7011 355/72 |
| 2017/0235232 A1 | 8/2017 | Toshima et al. | |
| 2018/0046737 A1 | 2/2018 | Willems et al. | |
| 2018/0329316 A1 | 11/2018 | Polo et al. | |

FOREIGN PATENT DOCUMENTS

| | | |
|---|---|---|
| CN | 102692829 A | 9/2012 |
| CN | 107533299 A | 1/2018 |
| CN | 108112267 A | 6/2018 |

(Continued)

OTHER PUBLICATIONS

Machine translation of the written opinion of PCT/CN2021/114113, dated Sep. 2022.*

(Continued)

*Primary Examiner* — Peter B Kim
(74) *Attorney, Agent, or Firm* — SYNCODA LLC; Feng Ma

(57) ABSTRACT

A method and device for enhancing alignment performance of a lithographic device can provide an optimal alignment light source type to perform alignment according to product features. Overlay performance of the product can be improved, wafer reject can be reduced, and production efficiency can be enhanced.

17 Claims, 3 Drawing Sheets

(56) References Cited

FOREIGN PATENT DOCUMENTS

| | | |
|---|---|---|
| CN | 108121177 A | 6/2018 |
| CN | 108121178 A | 6/2018 |
| CN | 110088878 A | 8/2019 |
| CN | 110941153 A | 3/2020 |
| CN | 113050395 A | 6/2021 |
| JP | 2007165649 A | 6/2007 |
| KR | 20080008042 A | 1/2008 |

OTHER PUBLICATIONS

First Office Action of the Chinese application No. 202110314210.8, dated Feb. 21, 2022.

* cited by examiner

US 11,796,927 B2

METHOD AND DEVICE FOR ENHANCING ALIGNMENT PERFORMANCE OF LITHOGRAPHIC DEVICE

CROSS-REFERENCE TO RELATED APPLICATIONS

The present application is a continuation of International Patent Application No. PCT/CN2021/114113 filed on Aug. 23, 2021, which claims priority to Chinese Patent Application No. 202110314210.8 filed on Mar. 24, 2021. The disclosures of the above-referenced applications are hereby incorporated by reference in their entirety.

BACKGROUND

A lithographic device is the most important device during processing of an integrated circuit. Alignment is one of main processes of the lithographic device. Relative position relationship among a mask, a mask platform, a wafer, and a workpiece table is determined through special marks on the mask, the mask platform, the wafer, and the workpiece table, so that a mask pattern can be accurately imaged on the wafer, thereby realizing overlay accuracy. Overlay accuracy is one of main technical indicators of a projection lithographic device. Alignment between the mask and the wafer is a key factor influencing the overlay accuracy.

SUMMARY

Embodiments of the disclosure provide a method for enhancing alignment performance of a lithographic device. The method includes the following operations.

A database is provided, and includes at least one data group. Each data group includes feature information of a wafer and a selected alignment light source group corresponding to the wafer, and the selected alignment light source group includes at least one selected alignment light source type.

A wafer to be aligned, feature information of the wafer to be aligned and a corresponding preset alignment light source type are provided.

Based on the feature information of the wafer to be aligned, the selected alignment light source type corresponding to the feature information is acquired from the database.

The selected alignment light source type is compared with a preset alignment light source type. When the selected alignment light source type is consistent with the preset alignment light source type, the preset alignment light source type is used as the alignment light source type of the wafer to be aligned, and when the selected alignment light source type is inconsistent with the preset alignment light source type, the selected alignment light source type is used as the alignment light source type of the wafer to be aligned.

Embodiments of the disclosure further provide a device for enhancing alignment performance of a lithographic device. The device includes a data storage unit, a processing unit, and a comparison determination unit.

The data storage unit is configured to store a database. The database includes at least one data group, each data group includes feature information of a wafer and a selected alignment light source group corresponding to the wafer, and the selected alignment light source group includes at least one selected alignment light source type.

The processing unit is configured to acquire feature information of a wafer to be aligned and a corresponding preset alignment light source type, and acquire a selected alignment light source type corresponding to the feature information of the wafer to be aligned from the database based on the feature information.

The comparison determination unit is configured to compare the selected alignment light source type with the preset alignment light source type. When the selected alignment light source type is consistent with the preset alignment light source type, the preset alignment light source type is used as the alignment light source type of the wafer to be aligned, and when the selected alignment light source type is inconsistent with the preset alignment light source type, the selected alignment light source type is used as the alignment light source type of the wafer to be aligned.

BRIEF DESCRIPTION OF THE DRAWINGS

In order to describe the technical solutions in embodiments of the disclosure more clearly, the drawings required to be used in the embodiments of the disclosure will be simply introduced below. It is apparent that the drawings in the following descriptions are only some embodiments of the disclosure. Those of ordinary skill in the art may further obtain other drawings according to these drawings without creative work.

DETAILED DESCRIPTION

Figure 1:
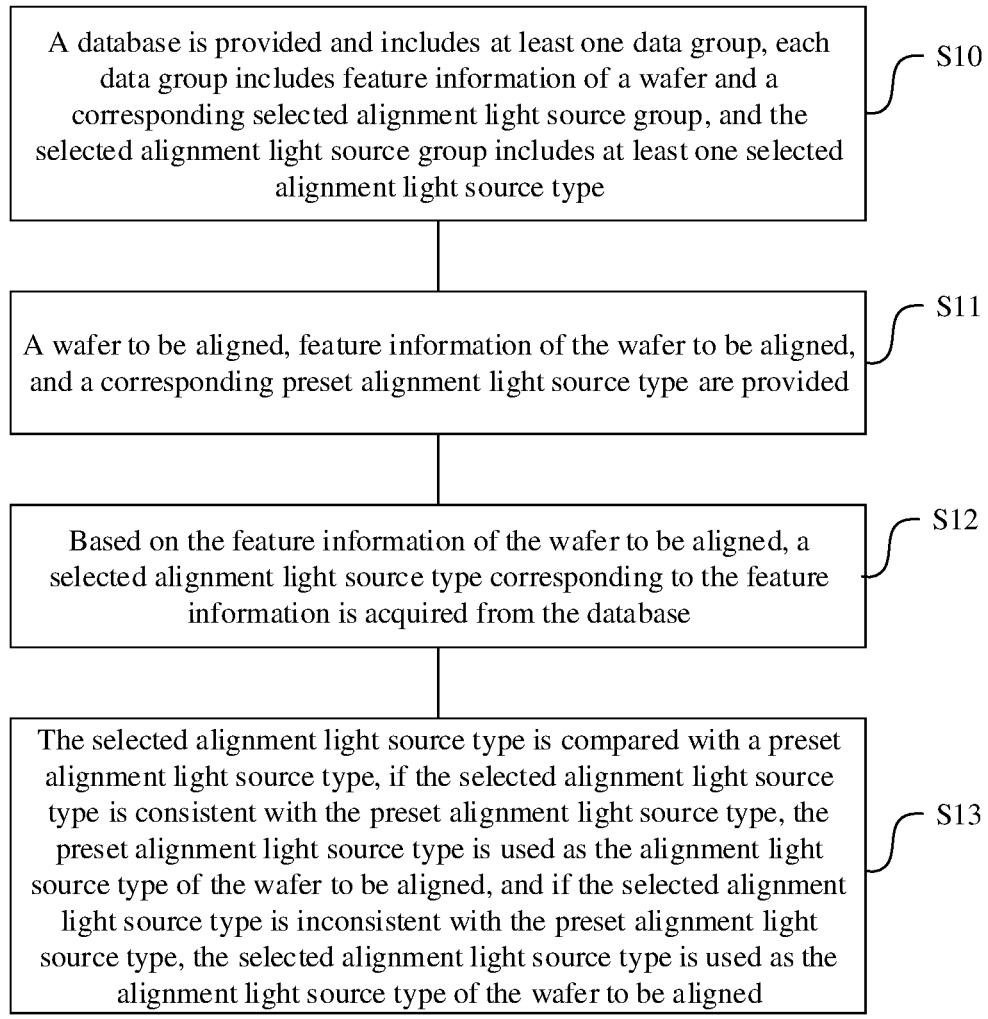
FIG. 1 is a schematic diagram of operations of a method for enhancing alignment performance of a lithographic device according to an embodiment of the disclosure.

In order to make the objectives, technical solutions and effects of the disclosure clearer, the disclosure will be further described below in combination with the drawings. It is to be understood that the embodiments described here are only a part of the embodiments of the disclosure but not all, and are not intended to limit the disclosure. Based on the embodiments in the disclosure, all other embodiments obtained by those skilled in the art without creative work shall fall within the protection scope of the disclosure.

Most lithographic devices adopt grating diffraction interference-based alignment systems. The essential features of such an alignment system include as follows. An illumination beam including a single wavelength or multiple wavelengths is diffracted on a grating alignment mark, and the generated diffracted lights in orders carry position information related to the alignment mark. The beams in different orders are spread out from a phase alignment grating at different diffraction angles. The diffracted beam of each order is collected by the alignment system, so that two symmetric positive and negative diffraction orders (such as ±1, ±2, and ±3 orders) are overlapped and coherent in an image plane or a pupil plane of the alignment system, forming interference signals in orders. When the alignment mark is scanned, the intensity change of the interference signals is recorded by a photodetector, and an alignment central position is determined through signal processing.

At present, the lithographic device has poor alignment performance, which may influence overlay performance of a wafer, and even cause wafer reject. Therefore, it is urgent to provide a method for enhancing alignment performance of a lithographic device, so as to resolve the above problems.

Embodiments of the method and device for enhancing alignment performance of a lithographic device according to the disclosure are described in detail below with reference to the accompanying drawings.

In some implementations, a lithographic device product has poor overlay performance and large wafer reject. Through research, it is found that the above situation is related to an alignment light source used by the lithographic device. The existing lithographic machine adopts one or two of four light source types: red light, green light, far-infrared (FIR) light, and near-infrared (NIR) light as an alignment light source. With the change of the technology, such as the change of layer stack, mark depth, duty cycle and the like, a default alignment light source type of the lithographic machine or a theoretical alignment light source type set by a product itself may not be the optimal alignment light source type of the product, which may influence the overlay performance of the product, and even cause wafer reject.

The disclosure provides a method for enhancing alignment performance of a lithographic device, which can provide the optimal alignment light source type according to product features, thereby enhancing the overlay performance of a product and reducing wafer reject.

FIG. 1 is a schematic diagram of operations of a method for enhancing alignment performance of a lithographic device according to an embodiment of the disclosure. Referring to FIG. 1, the method of the disclosure includes the following operations.

In S10, a database is provided, and includes at least one data group, each data group includes feature information of a wafer and a corresponding selected alignment light source group, and the selected alignment light source group includes at least one selected alignment light source type.

The wafer may be a blank wafer or a wafer formed with a function layer. The feature information includes, but is not limited to, product information of the wafer, such as a product batch number.

The selected alignment light source type includes, but is not limited to, red light, green light, FIR light, and NIR light. The selected alignment light source type is required to be consistent with an alignment light source type adopted by a lithographic device, or at least includes the alignment light source type adopted by the lithographic device.

In this embodiment, the selected alignment light source group is formed by ranking four types of alignment light source types. The four types of alignment light source types respectively are red light, green light, FIR light, and NIR light, and are ranked according to a set scheme. For example, one ranking order may be that: the first is the red light, the second is the FIR light, the third is the green light, and the fourth is the NIR light, and another ranking order may be that: the first is the green light, the second is the red light, the third is the FIR light, and the fourth is the NIR light.

In another embodiment of the disclosure, the selected alignment light source group is composed of one or more screened optimal alignment light source types. For example, the four alignment light source types respectively are red light, green light, FIR light, and NIR light. For a certain wafer, the optimal alignment light source type is the red light, so that the red light is taken as the selected alignment light source type to form the selected alignment light source group. For another example, for a certain wafer, the optimal alignment light source type is the red light and the green light, so that the red light and the green light are taken as the selected alignment light source types to form the selected alignment light source group.

The database may include a plurality of data groups. The feature information of wafers in different data groups is different, so as to distinguish different data groups. Specifically, in this embodiment, if the feature information of the wafer is a product batch number, the product batch numbers in different data groups are different, so as to distinguish different data groups.

The method for enhancing alignment performance of the lithographic device further includes a method for forming the database.

Figure 2:
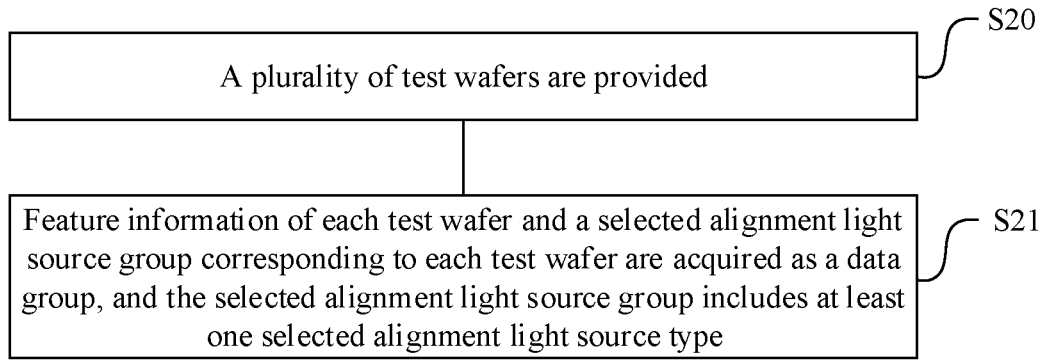
FIG. 2 is a schematic diagram of operations of a method for forming a database according to an embodiment of the disclosure.

FIG. 2 is a schematic diagram of operations of the method for forming the database according to an embodiment of the disclosure. Referring to FIG. 2, in this embodiment, the method for forming the database includes the following operations.

In S20, a plurality of test wafers are provided.

The test wafers may be blank wafers or wafers formed with function layers.

In S21, feature information of each test wafer and a selected alignment light source group corresponding to each test wafer are acquired as a data group, and the selected alignment light source group includes at least one selected alignment light source type.

The feature information of each test wafer includes product information of each test wafer, such as a product batch number. At least part of the product information of the test wafers is same as product information of the wafer to be aligned, so that the database may cover data of a product to be aligned.

Figure 3:
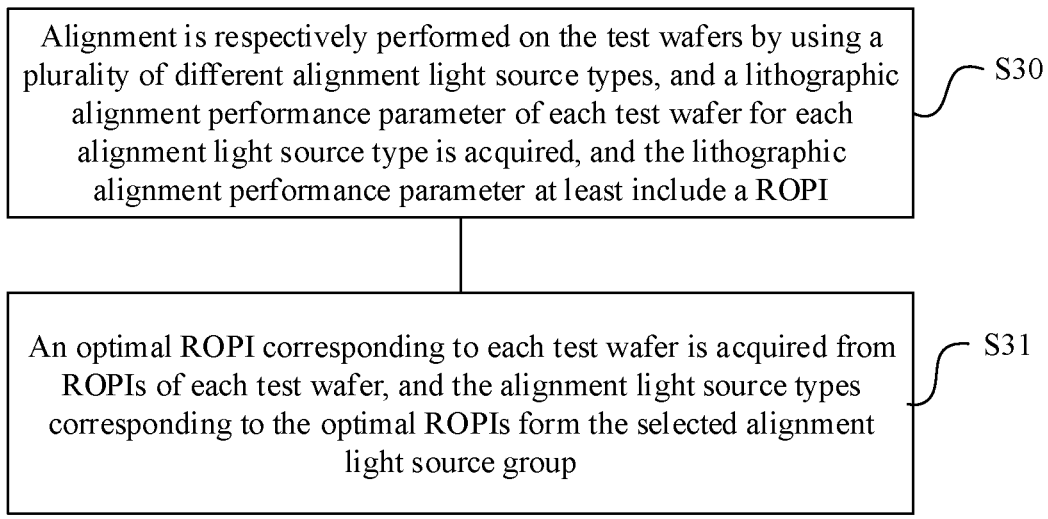
FIG. 3 is a schematic diagram of operations of acquiring a selected alignment light source group corresponding to each test wafer according to an embodiment of the disclosure.

Specifically, referring to FIG. 3, in this embodiment, the operation of acquiring the selected alignment light source group corresponding to each test wafer includes as follows.

In S30, alignment is respectively performed on the test wafers by using a plurality of different alignment light source types, and a lithographic alignment performance parameter of each test wafer for each alignment light source type is acquired, and the lithographic alignment performance parameter at least include a Residual Overlay Performance Indicator (ROPI).

The alignment light source types include, but are not limited to, red light, green light, FIR light, and NIR light, which are required to be consistent to an alignment light source type adopted by a lithographic device, or at least include the alignment light source type adopted by the lithographic device.

The ROPI indicates a non-compensable value after the current layer and the previous layer are aligned to a model. The ROPI is a known parameter used for evaluating a wafer process, which is not elaborated again.

In an embodiment of the disclosure, the lithographic alignment performance parameter further includes wafer quality (WQ) and a multiple correlation coefficient (MCC). The WQ describes signal quality when a light source sweeps through an optical grating. The MCC describes a similarity of an actual mark with a theoretical mark, and both parameters are known parameters used for evaluating the wafer process, which are not elaborated again.

In S31, an optimal ROPI corresponding to each test wafer is acquired from ROPIs of each test wafer, and the alignment light source types corresponding to the optimal ROPIs form the selected alignment light source group.

In this operation, an optimal alignment light source type is acquired by using the optimal ROPI, so as to form the selected alignment light source group.

Specifically, in this embodiment, a first value of the ROPIs in ascending order is taken as the optimal ROPI, and the corresponding alignment light source type is taken as the selected alignment light source type, so as to form the selected alignment light source group. In this case, the selected alignment light source group only includes one light source type. Thus, the selected alignment light source group is applicable for alignment with a single light source.

In another embodiment of the disclosure, a first value and a second value of the ROPIs in ascending order are taken as the optimal ROPIs, and the corresponding alignment light source types thereof are taken as the selected alignment light source types, to form the selected alignment light source group. In such case, the selected alignment light source group includes two light source types. Thus, the selected alignment light source group is applicable for alignment with two light sources.

In an embodiment of the disclosure, in order to further enhance the accuracy of the database, the ROPIs are screened by taking the WQ and the MCC as limitations. The optimal ROPI corresponding to each test wafer is acquired from the screened ROPIs. Specifically, after the operation in S30 is completed, the test wafers each having WQ greater than a first preset value and a MCC greater than a second preset value are selected. The ROPIs of the test wafers are taken as the screened ROPIs, and the optimal ROPI corresponding to each test wafer is acquired from the screened ROPIs. For example, the screened ROPIs are arranged in ascending order. The first preset value is 0.1%, and the second preset value is 0.7. In other embodiments of the disclosure, the first preset value and the second preset value may be adjusted according to actual situations.

In an embodiment of the disclosure, in S31, two situations are included. In one situation, the feature information of the test wafers is the same. In another situation, at least part of the feature information of the test wafers is different.

For the situation that the feature information of the test wafers is the same, the step of acquiring the optimal ROPI corresponding to each test wafer from ROPIs of each test wafer further includes the following operations.

The ROPIs of all the test wafers are arranged in ascending order.

A position of an area in which a degree of convergence of an alignment light source type is maximum is taken as a ranking position of the alignment light source type, so as to form the selected alignment light source group. Since the test wafers have same feature information, the ROPIs of the test wafers formed by the alignment light source types of the same types are close to each other. Thus, in this embodiment, the area with a maximum degree of convergence of the alignment light source type of a certain type is taken as the ranking position of the alignment light source type, so that the accuracy of ranking may be enhanced. For example, according to the ascending order of the ROPIs, i.e., a red light concentration area, a green light concentration area, an FIR light concentration area, and an NIR light concentration area in order, the order of the alignment light source types is red light, green light, FIR light, and NIR light. That is to say, the selected alignment light source type included in the selected alignment light source group may be the red light, or the red light and the green light.

For the situation that at least part of the feature information of the test wafers is different, in the operation of acquiring the lithographic alignment performance parameter of each test wafer for each alignment light source type in S30, the lithographic alignment performance parameters of the test wafers having the same feature information are jointly taken as the lithographic alignment performance parameters of the test wafers. That is to say, the lithographic alignment performance parameters of all the test wafers having the same feature information are taken together as a basis for screening in S31.

The above is the method for forming one data group. If a plurality of data groups are formed, the operations in S30 to S31 may be repeated.

In the above method for forming the database, the optimal ROPI is used to acquire the optimal alignment light source type, so as to form the selected alignment light source group. In another embodiment of the disclosure, the selected alignment light source group is formed by ranking a plurality of different alignment light source types.

Figure 4:
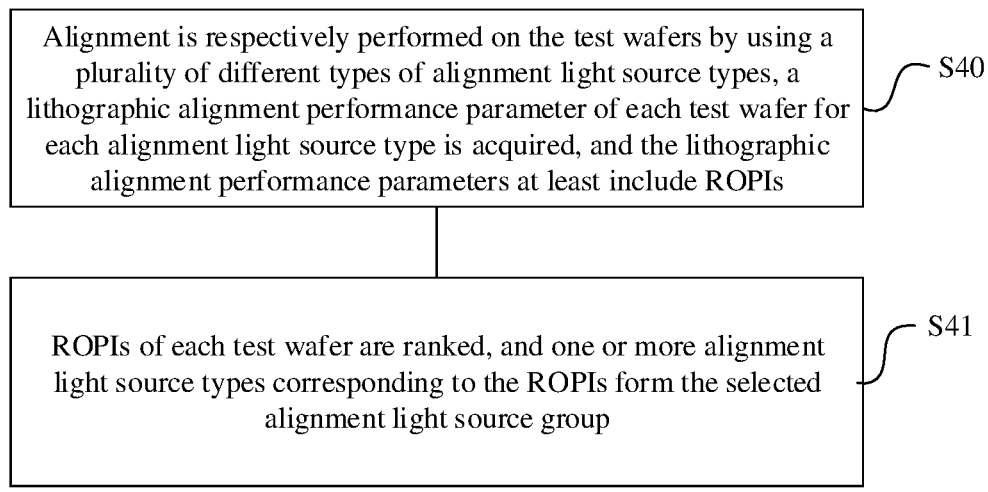
FIG. 4 is a schematic diagram of operations of a method for forming a database according to an embodiment of the disclosure.

Specifically, FIG. 4 is a schematic diagram of operations of a method for forming the database according to another embodiment of the disclosure. Referring to FIG. 4, the method includes the following operations.

In S40, alignment is respectively performed on the test wafers by using a plurality of different types of alignment light source types, a lithographic alignment performance parameter of each test wafer for each alignment light source type is acquired, and the lithographic alignment performance parameters at least include ROPIs. This operation is same as the operation in S30, which is not repeated again.

In S41, ROPIs of each test wafer are ranked, and one or more alignment light source types corresponding to the ROPIs form the selected alignment light source group.

In S41, the ROPIs of the test wafers are ranked in ascending order, and the alignment light source types corresponding to the ROPIs form the selected alignment light source group. For example, the alignment light source types in S40 include four alignment light source types, which respectively are, for example, red light, green light, FIR light, and NIR light. Alignment is performed on the test wafers having the same feature information by means of the four alignment light source types. The ROPIs of the test wafers are ranked in ascending order, and the alignment light source types corresponding to the ROPIs form the selected alignment light source group.

In the above embodiments, the ascending order is only a manner listed by the disclosure, and the descending order may also be adopted.

Further referring to FIG. 1, the method for enhancing alignment performance of the lithographic device includes the operation in S11 of providing a wafer to be aligned, feature information of the wafer to be aligned, and a corresponding preset alignment light source type.

In this operation, the wafer to be aligned is a wafer that actually needs to be processed on a production line. The feature information of the wafer to be aligned should be the same as the feature information of at least part of the wafers in the database, so that, in the subsequent step, the feature information is taken as an interface parameter between the wafer to be aligned and the database. The preset alignment light source type may be a light source type automatically set by the lithographic device, or factory setting parameters of the wafer to be aligned.

In S12, based on the feature information of the wafer to be aligned, a selected alignment light source type corresponding to the feature information is acquired from the database.

In this step, the feature information of the wafer to be aligned is compared with the feature information of the wafer in the data group. If the feature information of the wafer to be aligned is the same as the feature information of the wafer in the data group, the selected alignment light source type corresponding to the feature information of the wafer is acquired, and the operation in S13 is performed. If the feature information of the wafer to be aligned is different from the feature information of the wafer in the data group, the feature information of the wafer to be aligned is compared with the feature information in a next data group, until the feature information is the same as the feature information of products in the data group, and the operation in S13 is performed. If the entire database has no product information same as feature information of the wafer to be aligned, the method for enhancing alignment performance of the lithographic device ends.

In S13, the selected alignment light source type is compared with a preset alignment light source type. If the selected alignment light source type is consistent with the preset alignment light source type, the preset alignment light source type is used as the alignment light source type of the wafer to be aligned. If the selected alignment light source type is inconsistent with the preset alignment light source type, the selected alignment light source type is used as the alignment light source type of the wafer to be aligned.

In this step, if the database acquires the optimal alignment light source type to form the selected alignment light source group by using the optimal ROPI, the selected alignment light source type is compared with the preset alignment light source type. If the selected alignment light source type and the preset alignment light source type are consistent, the preset alignment light source type is used as the alignment light source type of the wafer to be aligned. If the selected alignment light source type and the preset alignment light source type are inconsistent, the selected alignment light source type is used as the alignment light source type of the wafer to be aligned.

In this step, if the selected alignment light source group in the database is formed by ranking a plurality of different alignment light source types, this step is divided into situations of a single alignment light source type and a mixed alignment light source type. Details are as follows.

For a product adopting the single alignment light source type, the first selected alignment light source type in the selected alignment light source group is compared with the preset alignment light source type. If the first selected alignment light source type and the preset alignment light source type are consistent, the preset alignment light source type is used as the alignment light source type of the wafer to be aligned. If the first selected alignment light source type and the preset alignment light source type are inconsistent, the first selected alignment light source type is used as the alignment light source type of the wafer to be aligned.

For a product adopting the mixed alignment light source type, the first and second selected alignment light source types in the selected alignment light source group are compared with the preset alignment light source type. If the preset alignment light source type is consistent with at least one of the selected alignment light source types, the preset alignment light source type is used as the alignment light source type of the wafer to be aligned. If the preset alignment light source type is inconsistent with both the first and second selected alignment light source types, the first or second selected alignment light source type is used as the alignment light source type of the wafer to be aligned. In some lithographic devices, the mixed alignment light source type usually refers to a mixture of two types of light sources. Thus, in this step, only the first and second selected alignment light source types are selected to compare with the preset alignment light source type. In other embodiments of the disclosure, according to the number of the mixed alignment light source types adopted by the lithographic device, a plurality of selected alignment light source types may also be selected to compare with the preset alignment light source type.

The method for enhancing alignment performance of the lithographic device according to the disclosure can select the optimal alignment light source type according to the characteristics of the product, so that the overlay performance of the product may be greatly enhanced, and wafer reject may be greatly reduced.

Figure 5:
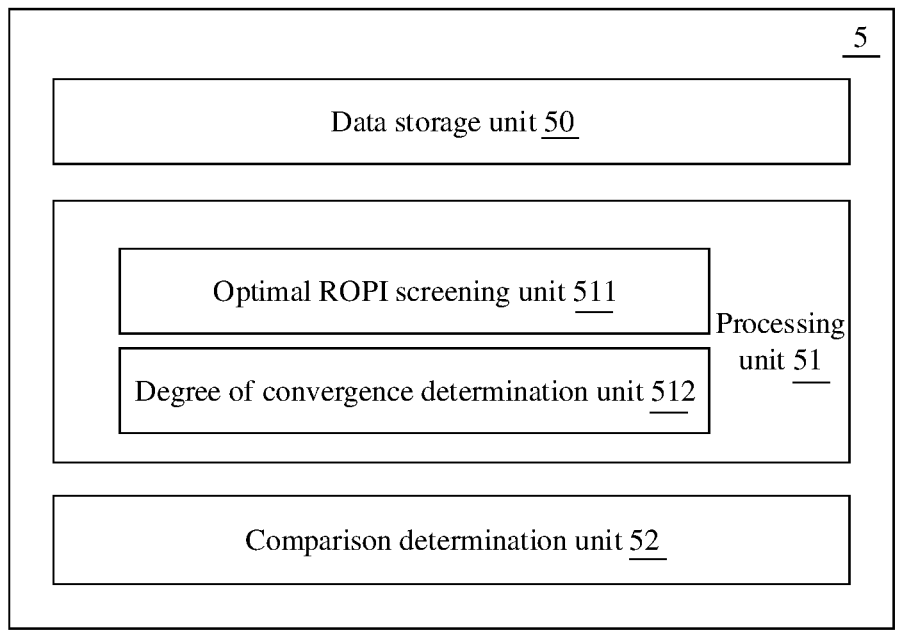
FIG. 5 is a structural block diagram of a device for enhancing alignment performance of a lithographic device according to an embodiment of the disclosure.

The disclosure further provides a device configured to implement the above method for enhancing alignment performance of the lithographic device. FIG. 5 is a structural block diagram of a device for enhancing alignment performance of a lithographic device according to the disclosure. The device 5 for enhancing alignment performance of the lithographic device according to the disclosure includes a data storage unit 50, a processing unit 51, and a comparison determination unit 52.

The data storage unit 50 is configured to store a database. The database includes at least one data group. Each data group includes feature information of a wafer and a corresponding selected alignment light source group, and the selected alignment light source group includes at least one selected alignment light source type. The wafer may be a blank wafer or a wafer formed with a function layer. The feature information includes, but is not limited to, product information of the wafer, such as a product batch number. The selected alignment light source type includes, but is not limited to, red light, green light, FIR light, and NIR light. The selected alignment light source type is required to be consistent with an alignment light source type adopted by a lithographic device, or at least includes the alignment light source type adopted by the lithographic device.

The database is prestored in the data storage unit 50. The database acquires an optimal alignment light source type to form a selected alignment light source group by using an optimal ROPI, or the selected alignment light source group in the database is formed by ranking a plurality of different alignment light source types.

The processing unit 51 is configured to acquire feature information of a wafer to be aligned and a corresponding preset alignment light source type, and acquire, based on the feature information of the wafer to be aligned, a selected alignment light source type corresponding to the feature information from the database.

The wafer to be aligned is a wafer that actually needs to be processed on a production line. The feature information of the wafer to be aligned is the same as the feature information of at least part of the wafers in the database. The preset alignment light source type may be a light source type automatically set by the lithographic device, or factory setting parameters of the wafer to be aligned.

In another embodiment of the disclosure, the processing unit 51 is further configured to acquire feature information of a test wafer and a selected alignment light source group corresponding to the test wafer as a data group to form the database.

The processing unit 51 further includes an optimal ROPI screening unit 511, configured to acquire an optimal ROPI corresponding to each test wafer from ROPIs of each test wafer. The optimal ROPI screening unit is further configured to screen the test wafers each having WQ greater than a first preset value and an MCC greater than a second preset value.

The processing unit 51 further includes a degree of convergence determination unit 512, configured to determine a degree of convergence of an alignment light source type, and take a position of an area with a maximum degree of convergence as a ranking position of the alignment light source type, so as to form the selected alignment light source group.

The comparison determination unit 52 is configured to compare the selected alignment light source type with the preset alignment light source type. If the selected alignment light source type and the preset alignment light source type are consistent, the preset alignment light source type is used as the alignment light source type of the wafer to be aligned. If the selected alignment light source type and the preset alignment light source type are inconsistent, the selected alignment light source type is used as the alignment light source type of the wafer to be aligned.

If the database acquires the optimal alignment light source type to form the selected alignment light source group by using the optimal ROPI, the selected alignment light source type is compared with the preset alignment light source type. If the selected alignment light source type and the preset alignment light source type are consistent, the preset alignment light source type is used as the alignment light source type of the wafer to be aligned. If the selected alignment light source type and the preset alignment light source type are inconsistent, the selected alignment light source type is used as the alignment light source type of the wafer to be aligned.

If the selected alignment light source group in the database is formed by ranking a plurality of different alignment light source types, the above may be divided into situations of a single alignment light source type and a mixed alignment light source type. Details are as follows.

For a product adopting the single alignment light source type, the first selected alignment light source type in the selected alignment light source group is compared with the preset alignment light source type. If the first selected alignment light source type and the preset alignment light source type are consistent, the preset alignment light source type is used as the alignment light source type of the wafer to be aligned. If the first selected alignment light source type and the preset alignment light source type are inconsistent, the first selected alignment light source type is used as the alignment light source type of the wafer to be aligned.

For a product adopting the mixed alignment light source type, the first and second selected alignment light source types in the selected alignment light source group are compared with the preset alignment light source type. If the preset alignment light source type is consistent with at least one of the selected alignment light source types, the preset alignment light source type is used as the alignment light source type of the wafer to be aligned. If the preset alignment light source type is inconsistent with both the first and second selected alignment light source types, the first or second selected alignment light source type is used as the alignment light source type of the wafer to be aligned. In some lithographic devices, the mixed alignment light source type usually refers to a mixture of two types of light sources. Thus, only the first and second selected alignment light source types are selected to compare with the preset alignment light source type. In other embodiments of the disclosure, according to the number of the mixed alignment light source types adopted by the lithographic device, a plurality of the selected alignment light source types may also be selected in order to compare with the preset alignment light source type.

In an embodiment of the disclosure, the device for enhancing alignment performance of the lithographic device includes a memory and a processor. The memory may implement the functions corresponding to the data storage unit 50, and the processor may implement the functions corresponding to the processing unit 51 and a comparison determination unit 52. It is to be understood that in the embodiment of the disclosure, the processor may be a universal processor, a Digital Signal Processor (DSP), an Application Specific Integrated Circuit (ASIC) and a Field Programmable Gate Array (FPGA) or other programmable logic devices, discrete gates or transistor logic devices, and discrete hardware component. The memory may be any memory with a storage function, such as volatile memory or a non-volatile memory, or may include the volatile memory and the non-volatile memory.

The above is only a part of implementation modes of the disclosure. It should be noted that several improvements and refinements made by those of ordinary skill in the art without departing from the principle of the disclosure shall fall within the scope of protection of the disclosure.

What is claimed is:

1. A method for enhancing alignment performance of a lithographic device, comprising:
   providing a database, wherein the database comprises at least one data group, each data group comprises feature information of a wafer and a selected alignment light source group corresponding to the wafer, and the selected alignment light source group comprises at least one selected alignment light source type;
   providing a wafer to be aligned, feature information of the wafer to be aligned and a corresponding preset alignment light source type, the preset alignment light source type being a light source type automatically set by the lithographic device, or factory setting parameters of the wafer to be aligned;
   acquiring, based on the feature information of the wafer to be aligned, a selected alignment light source type corresponding to the feature information from the database;
   comparing the selected alignment light source type with the preset alignment light source type; and
   taking the preset alignment light source type as the alignment light source type of the wafer to be aligned when the selected alignment light source type is consistent with the preset alignment light source type, and taking the selected alignment light source type as the alignment light source type of the wafer to be aligned when the selected alignment light source type is inconsistent with the preset alignment light source type;
   wherein the method further comprises: determining a degree of convergence of an alignment light source type, and determining a ranking position of the alignment light source type based on an area of a maximum degree of convergence of the alignment light source type, to form the selected alignment light source group.

2. The method of claim 1, further comprising forming the database including: providing a plurality of test wafers, and acquiring feature information of each test wafer and a selected alignment light source group corresponding to each test wafer as the data group, the selected alignment light source group comprising at least one selected alignment light source type.

3. The method of claim 2, wherein the feature information of each test wafer comprises product information of the test wafer, the feature information of the wafer to be aligned comprises product information of the wafer to be aligned, and product information of at least part of the test wafers is same as the product information of the wafer to be aligned.

4. The method of claim 2, wherein said acquiring the selected alignment light source group corresponding to each test wafer comprises:
respectively performing alignment on the test wafers by using a plurality of different alignment light source types, and acquiring a lithographic alignment performance parameter of each test wafer for each alignment light source type, the lithographic alignment performance parameter at least comprising a Residual Overlay Performance Indicator (ROPI); and
acquiring an optimal ROPI corresponding to each test wafer from ROPIs of each test wafer, the alignment light source type corresponding to the optimal ROPI forming the selected alignment light source group.

5. The method of claim 4, wherein said acquiring the optimal ROPI corresponding to each test wafer from ROPIs of each test wafer comprises:
taking a first value of the ROPIs in ascending order as the optimal ROPI.

6. The method of claim 4, wherein said acquiring the optimal ROPI corresponding to each test wafer from ROPIs of each test wafer comprises:
taking a first value and a second value of the ROPIs in ascending order as the optimal ROPI.

7. The method of claim 6, wherein in the operation of comparing the selected alignment light source types with the preset alignment light source type, if the preset alignment light source type is consistent with at least one of the selected alignment light source types, taking the preset alignment light source type as the alignment light source type of the wafer to be aligned, and if the preset alignment light source type is inconsistent with all of the selected alignment light source types, taking the selected alignment light source types as the alignment light source type of the wafer to be aligned.

8. The method of claim 4, wherein the lithographic alignment performance parameters further comprise Wafer Quality (WQ) and a Multiple Correlation Coefficient (MCC), the ROPIs are screened by taking the WQ and the MCC as limitations, and the optimal ROPI corresponding to each test wafer is acquired from the screened ROPIs.

9. The method of claim 8, further comprising screening the ROPIs by taking the WQ and the MCC as limitations by:
selecting test wafers of which the WQ is greater than a first value and the MCC is greater than a second value; and
acquiring ROPIs of the test wafers as the screened ROPIs.

10. The method of claim 9, wherein the first value is 0.1%, and the second value is 0.7.

11. The method of claim 4, wherein at least part of the test wafers have different feature information, and in the operation of acquiring the lithographic alignment performance parameter of each test wafer for each alignment light source type, lithographic alignment performance parameters of the test wafers having the same feature information are jointly taken as the lithographic alignment performance parameters of the test wafers.

12. The method of claim 2, wherein said acquiring the selected alignment light source group corresponding to each test wafer comprises:
respectively performing alignment on the test wafers by using a plurality of different alignment light source types, and acquiring a lithographic alignment performance parameter of each test wafer for each alignment light source type, the lithographic alignment performance parameters at least comprising a ROPI; and
ranking ROPIs of each test wafer, and forming the selected alignment light source group by using one or more alignment light source types corresponding to the ROPIs.

13. The method of claim 1, wherein the selected alignment light source type and the preset alignment light source type are one of red light, green light, far-infrared (FIR) light, and near-infrared (NIR) light.

14. A device for enhancing alignment performance of a lithographic device, comprising:
a memory, configured to store a database, wherein the database comprises at least one data group, each data group comprises feature information of a wafer and a selected alignment light source group corresponding to the wafer, and the selected alignment light source group comprises at least one selected alignment light source type; and
a processor, configured to:
acquire feature information of a wafer to be aligned and a corresponding preset alignment light source type, and acquire a selected alignment light source type corresponding to the feature information of the wafer to be aligned from the database based on the feature information, the preset alignment light source type being a light source type automatically set by the lithographic device, or factory setting parameters of the wafer to be aligned; and
compare the selected alignment light source type with the preset alignment light source type, wherein the preset alignment light source type is taken as the alignment light source type of the wafer to be aligned when the selected alignment light source type is consistent with the preset alignment light source type, and the selected alignment light source type is taken as the alignment light source type of the wafer to be aligned when the selected alignment light source type is inconsistent with the preset alignment light source type;
wherein the processor is further configured to determine a degree of convergence of an alignment light source type, and determine a ranking position of the alignment light source type based on an area of a maximum degree of convergence of the alignment light source type, to form the selected alignment light source group.

15. The device of claim 14, wherein the processor is further configured to acquire the feature information of each test wafer and a selected alignment light source group corresponding to each test wafer as the data group.

16. The device of claim 14, wherein the processor is further configured to acquire an optimal ROPI corresponding to each test wafer from ROPIs of each test wafer.

17. A device for enhancing alignment performance of a lithographic device, comprising:
a memory, configured to store a database, wherein the database comprises at least one data group, each data group comprises feature information of a wafer and a selected alignment light source group corresponding to the wafer, and the selected alignment light source group comprises at least one selected alignment light source type; and a processor, configured to:

acquire feature information of a wafer to be aligned and a corresponding preset alignment light source type, and acquire a selected alignment light source type corresponding to the feature information of the wafer to be aligned from the database based on the feature information, the preset alignment light source type being a light source type automatically set by the lithographic device, or factory setting parameters of the wafer to be aligned;

compare the selected alignment light source type with the preset alignment light source type, wherein the preset alignment light source type is taken as the alignment light source type of the wafer to be aligned when the selected alignment light source type is consistent with the preset alignment light source type, and the selected alignment light source type is taken as the alignment light source type of the wafer to be aligned when the selected alignment light source type is inconsistent with the preset alignment light source type; and acquire an optimal ROPI corresponding to each test wafer from ROPIs of each test wafer;

wherein the optimal ROPI screening unit is further configured to screen the test wafers of which Wafer Quality (WQ) is greater than a first value and a Multiple Correlation Coefficient (MCC) is greater than a second value.

* * * * *